(12) United States Patent
Wang et al.

(10) Patent No.: US 12,278,113 B2
(45) Date of Patent: Apr. 15, 2025

(54) METHOD FOR MANUFACTURING SEMICONDUCTOR STRUCTURE

(71) Applicant: CHANGXIN MEMORY TECHNOLOGIES, INC., Hefei (CN)

(72) Inventors: Zhaohui Wang, Hefei (CN); Wentao Xu, Hefei (CN); Qiao Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 378 days.

(21) Appl. No.: 17/950,993

(22) Filed: Sep. 22, 2022

(65) Prior Publication Data
US 2023/0018973 A1 Jan. 19, 2023

(30) Foreign Application Priority Data

Aug. 4, 2022 (CN) .......................... 202210935724.X

(51) Int. Cl.
*H01L 21/308* (2006.01)
*H01L 21/311* (2006.01)
*H01L 21/768* (2006.01)

(52) U.S. Cl.
CPC .... *H01L 21/3086* (2013.01); *H01L 21/31144* (2013.01); *H01L 21/76897* (2013.01); *H01L 21/7688* (2013.01)

(58) Field of Classification Search
None
See application file for complete search history.

(56) References Cited

U.S. PATENT DOCUMENTS

| | | | | |
|---|---|---|---|---|
| 2002/0068399 A1* | 6/2002 | Divakaruni | ........ | H10B 12/0385 438/246 |
| 2008/0061340 A1* | 3/2008 | Heineck | ................ | H01L 29/945 257/E21.651 |
| 2014/0024215 A1* | 1/2014 | Cheng | .................... | H01B 13/00 438/689 |
| 2016/0172356 A1* | 6/2016 | Cheng | .................... | H01L 28/20 257/379 |
| 2017/0148810 A1* | 5/2017 | Kai | ........................ | H01L 23/535 |
| 2021/0134659 A1* | 5/2021 | Wei | .................... | H01L 21/76816 |
| 2023/0240070 A1* | 7/2023 | Funayama | ............ | H10B 41/27 |
| 2024/0021433 A1* | 1/2024 | Falk | .................... | H01L 21/3086 |

FOREIGN PATENT DOCUMENTS

CN 114270479 A 4/2022

* cited by examiner

*Primary Examiner* — Allan W. Olsen
(74) *Attorney, Agent, or Firm* — Syncoda LLC; Feng Ma

(57) ABSTRACT

Embodiments of the present invention provide a method for manufacturing a semiconductor structure, which includes: a base is provided and a stack layer is formed on the base, wherein the stack layer includes at least a first sacrificial layer, and a material of the first sacrificial layer includes an amorphous elemental semiconductor material; second hard mask patterns are formed on the first sacrificial layer through a self-aligned process; a doping process is performed, which includes the operation that a region of the first sacrificial layer exposed from gaps between the second hard mask patterns is doped; the second hard mask patterns are removed; and an undoped region of the first sacrificial layer is removed through a selective etching process so as to form first sacrificial patterns.

13 Claims, 14 Drawing Sheets

METHOD FOR MANUFACTURING SEMICONDUCTOR STRUCTURE

CROSS REFERENCE TO RELATED APPLICATION

The application is based on and claims priority to Chinese Patent Application No. 202210935724.X filed on Aug. 4, 2022, the content of which is incorporated herein by reference.

TECHNICAL FIELD

The disclosure relates to the technical field of semiconductor, and in particular to a method for manufacturing a semiconductor structure.

BACKGROUND

With continuous shrinking of the size of the Dynamic Random Access Memory (DRAM), the feature critical size of semiconductor devices continues to decrease, and is approaching optical physical limit of photolithography. At present, the self-aligned process, such as Self-Aligned Double Patterning (SADP) process or Self-Aligned Quadruple Patterning (SAQP) process, is one of key technologies to realize smaller patterns. However, stability of the existing self-aligned process is poor. Therefore, how to improve the stability of self-aligned process has become a technical problem that is urgent to be solved.

SUMMARY

According to a first aspect of the embodiments of the present disclosure, a method for manufacturing a semiconductor structure is provided, which includes the following operations.

A base is provided and a stack layer is formed on the base. Herein the stack layer includes at least a first sacrificial layer, and a material of the first sacrificial layer includes an amorphous elemental semiconductor material.

Second hard mask patterns are formed on the first sacrificial layer through a self-aligned process.

A doping process is performed, which includes the operation that a region of the first sacrificial layer exposed from gaps between the second hard mask patterns is doped.

The second hard mask patterns are removed.

An undoped region of the first sacrificial layer is removed through a selective etching process, so as to form first sacrificial patterns.

DETAILED DESCRIPTION

Figure 1:
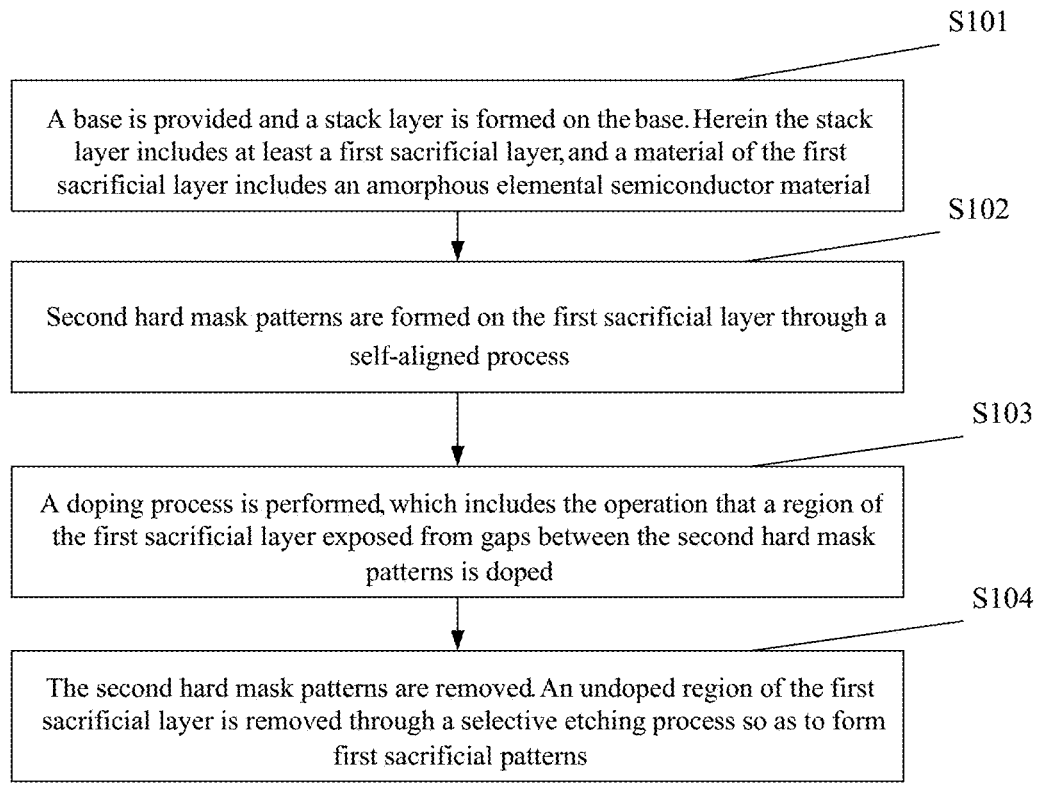
FIG. 1 is a flowchart of a method for manufacturing a semiconductor structure according to an embodiment of the present disclosure.

Exemplary embodiments disclosed by the present disclosure will be described in more detail below with reference to the accompanying drawings. Although exemplary embodiments of the present disclosure are illustrated in the drawings, it should be understood that the present disclosure may be implemented in various forms and should not be limited by the specific embodiments set forth herein. Rather, these embodiments are provided to enable a more thorough understanding of the disclosure and to enable the full scope of the disclosure to be conveyed to those skilled in the art.

In the following description numerous specific details are given to provide a more thorough understanding of the disclosure. However it will be apparent to those skilled in the art that the present disclosure may be practiced without one or more of these details. In other examples some technical features well known in the art are not described in order to avoid confusion with the present disclosure; That is all features of the actual embodiment are not described herein and well-known functions and structures are not described in detail.

In the drawings, the dimensions of layers, regions and elements and their relative dimensions may be exaggerated for clarity. Throughout the description, the same reference numerals denote the same elements.

It should be understood that when an element or layer is referred to as "on", "adjacent to", "connected to" or "coupled to" the other elements or layers, it can be directly on, adjacent to, connected to or coupled to the other elements or layers. Alternatively, there may exist intermediate elements or layers. On the contrary, when elements are referred to as "directly on", "directly adjacent to", "directly connected to" or "directly coupled to" the other elements or layers, there does not exist the intervening elements or layers. It should be understood that although the terms (e.g. first, second, third, etc.) can be used to describe various elements, components, areas, layers and/or parts, such elements, components, areas, layers and/or parts should not be limited by these terms. These terms are only used to distinguish one element, component, area, layer or part from another element, component, area, layer or part. Therefore, without departing from the teachings of the present disclosure, the first element, component, area, layer or part discussed below can be represented as a second element, component, area, layer or part. However, when the second element, component, area, layer or part are discussed, it does not mean that the first element, component, area, layer or part must exist in this disclosure.

Spatial relationship terms such as "under", "below", "down", "above", "on", "over" and the like, can be used here for convenience of description, so as to describe the relationship between one element or feature and other elements or features shown in the figure. It should be appreciated that in addition to the orientations shown in the figure, the spatial relationship terms also intend to include different orientations of devices in use and operation. For example, if the device in the drawing is flipped, the element or feature described as "under" or "below" the other elements or features will be "on" the other elements or features. Therefore, the exemplary terms "below" and "under" may include upper and lower orientations. The device may additionally be oriented (being rotated through 90 degrees or other orientation) and the spatial relationship terms used herein are interpreted accordingly.

The terms used herein are intended only to describe specific embodiments and are not intended to be a limitation to the present disclosure. The expressions of singular form used herein such as "one", "a" and "the" are also intended to include the plural forms unless the context clearly indicates otherwise. It should also be understood that the terms "comprise" and/or "include" used in the description refer to the existence of the features, integers, steps, operations, elements and/or components, but do not exclude the existence or addition of one or more other features, integers, steps, operations, elements, components and/or groups. When used herein, the term "and/or" includes any and all combinations of the relevant listed items.

With the continuous shrinking of the sizes of the DRAM, feature critical sizes of semiconductor devices continue to decrease. At present, self-aligned processes (e.g. SADP process or SAQP process) are commonly used in the industry to realize processing of smaller patterns. The existing self-aligned process has etching load effect, which leads to the inability to accurately control the critical sizes and the etching depth, thereby resulting poor electrical performance and reliability of the formed semiconductor structure.

Based on the above, embodiments of the present disclosure provide a method for manufacturing a semiconductor structure. As illustrated in FIG. 1, the method includes the following operations.

At block S101, a base is provided and a stack layer is formed on the base. The stack layer includes at least a first sacrificial layer, and a material of the first sacrificial layer includes an amorphous elemental semiconductor material.

At block S102, second hard mask patterns are formed on the first sacrificial layer through a self-aligned process.

At block S103, a doping process is performed, which includes the operation that a region of the first sacrificial layer exposed from gaps between the second hard mask patterns is doped.

At block S104, the second hard mask patterns are removed. An undoped region of the first sacrificial layer is removed through a selective etching process, so as to form first sacrificial patterns.

The method for manufacturing the semiconductor structure provided in the present disclosure will be described in further detail below with reference to specific embodiments.

Figure 2:
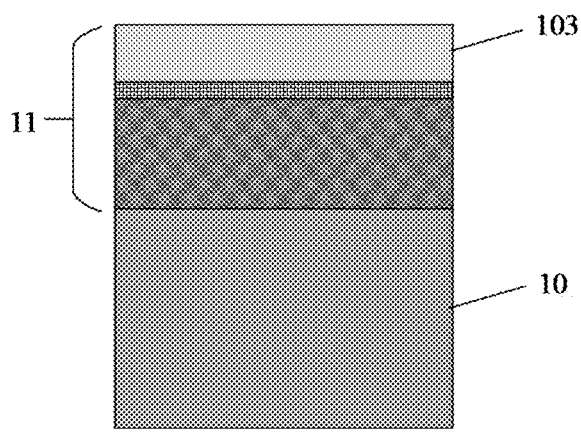
FIG. 2 is a structural diagram of a semiconductor structure in a manufacturing process according to the embodiments of the present disclosure.

Block S101 is performed. As illustrated in FIG. 2, a base 10 is provided, and a stack layer 11 is formed on the base 10. The stack layer 11 includes at least the first sacrificial layer 103, and the material of the first sacrificial layer 103 includes the amorphous elemental semiconductor material.

The first sacrificial layer includes the amorphous elemental semiconductor material. In implementation of the subsequent doping process, the material of a single component can be conducive to the formation of covalent bonds and can avoid influence of diffusion of other elements. In addition, amorphous materials have no obvious orientation, and subsequent wet etching has a stable etching rate, and good consistency and uniformity, and therefore the etching process has good controllability and stability.

In practical operation, the base 10 may be, for example, a simple semiconductor material substrate (e.g. silicon (Si) substrate, germanium (Ge) substrate, etc.), a composite semiconductor material substrate (e.g. silicon germanium (SiGe) substrate, etc.), and a silicon on insulator (SOI) substrate, a germanium on insulator (GeOI) substrate, etc. The first sacrificial layer 103 may include, for example, amorphous silicon (Si), amorphous germanium (Ge), amorphous tin (Sn) or the like. The stack layer 11 may further include a film layer other than the first sacrificial layer 103, which will not be specifically limited herein.

At block S102, the second hard mask patterns 19 are formed on the first sacrificial layer 103 through the self-aligned process.

In some embodiments, the self-aligned process includes one or more of a self-aligned double patterning process, a self-aligned quadruple patterning process and a self-aligned reverse patterning process.

In some embodiments, the self-aligned process is the self-aligned double patterning process, and the method for manufacturing the semiconductor structure is used for manufacturing at least one of a peripheral conductive structure or a bit line contact.

The following description is given by taking manufacturing a peripheral conductive structure through the self-aligned double patterning process as an example. When the self-aligned double patterning process is used for manufacturing the peripheral conductive structure, as illustrated in FIG. 3A to 3D, the stack layer 11 further includes a second hard mask layer 104 located above the first sacrificial layer 103, a second sacrificial layer 108 located above the second hard mask layer 104 and a fourth etching stop layer 109 located above the second sacrificial layer 108. The second hard mask patterns 19 are formed on the first sacrificial layer 103 through the self-aligned process, which includes the following operations. A patterned photoresist layer 12 is formed on the fourth etching stop layer 109. The fourth etching stop layer 109 and the second sacrificial layer 108 are etched to transfer the patterned photoresist layer 12 to the second sacrificial layer 108, so as to form second sacrificial patterns 13. A first sidewall material layer 14 is formed on the second sacrificial patterns 13 and the second hard mask layer 104. The first sidewall material layer 14 is etched with the first sidewall material layer 14 on sidewalls of the second sacrificial patterns 13 being retained. The second sacrificial patterns 13 are removed to expose the second hard mask layer 104. The second hard mask layer 104 is etched with the retained first sidewall material layer 14 as a mask, so as to form the second hard mask patterns 19.

Figure 3A:
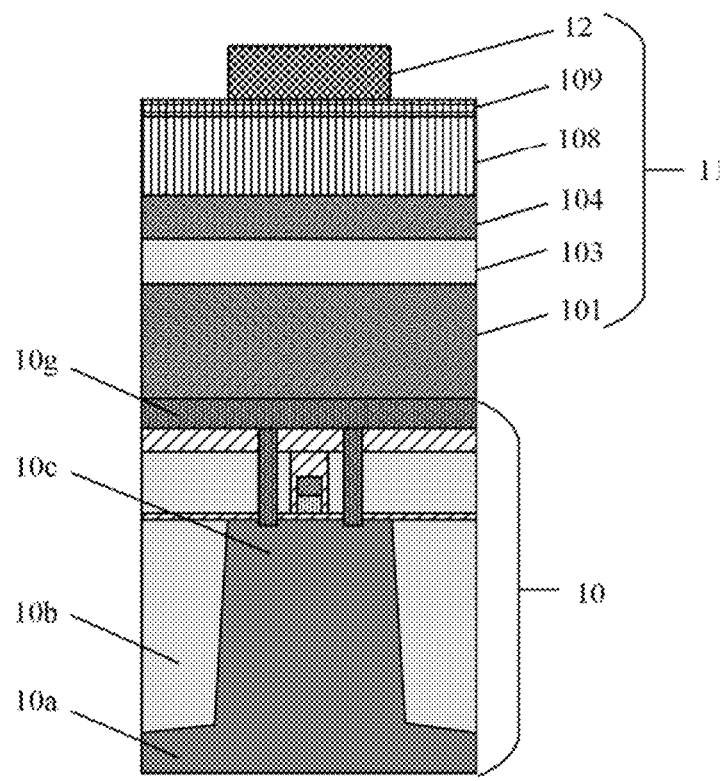
FIG. 3A to 3D are structural diagrams of the semiconductor structure in the manufacturing process according to the embodiments of the present disclosure.
Figure 3B:
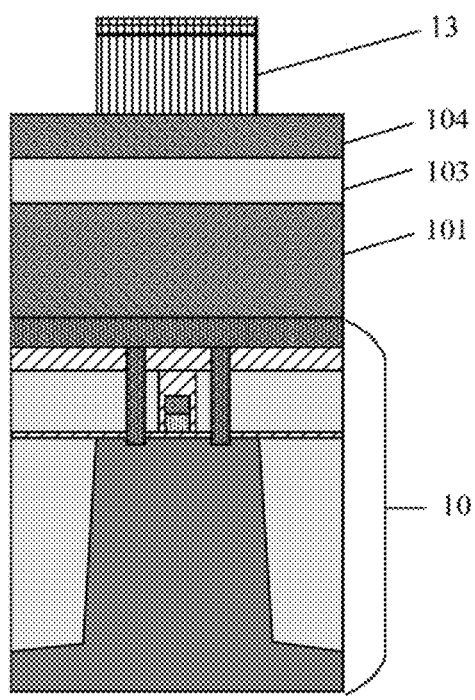
Figure 3C:
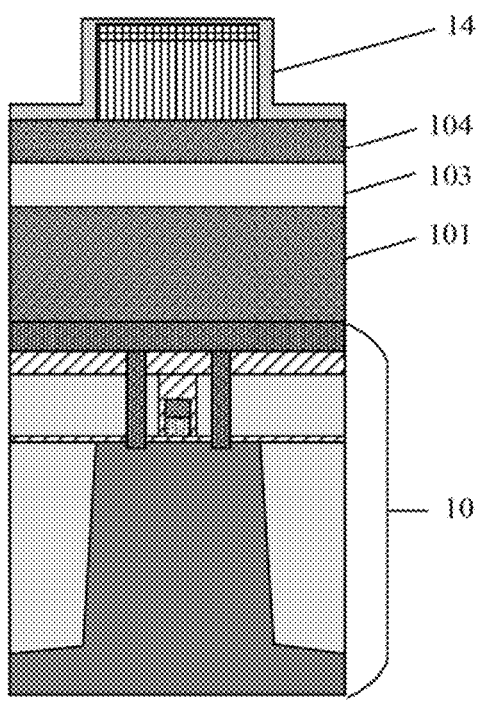
Figure 3D:
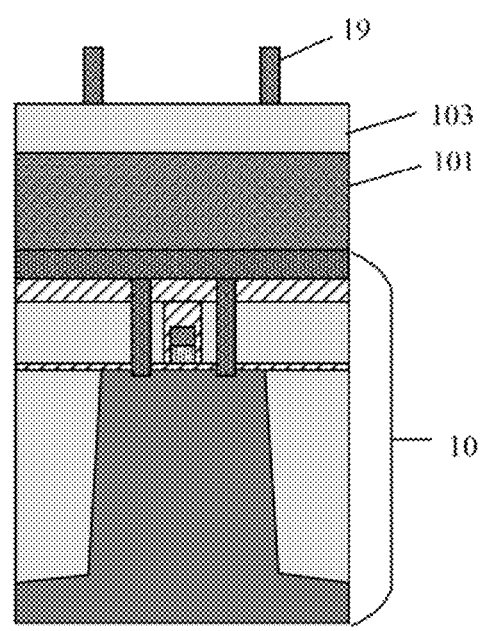

Specifically, when manufacturing a conductive contact in the semiconductor structure, as illustrated in FIG. 3A, the base 10 may include a substrate 10a, the substrate 10a may be, for example, a simple semiconductor material substrate (e.g. Si substrate, Ge substrate, etc.), a composite semiconductor material substrate (e.g. SiGe substrate, etc.), an SOI substrate, or a GeOI substrate, etc. An isolation structure 10b in the substrate 10a may include shallow trenches and an isolation material filled in the shallow trenches. The isolation structure 10b isolates the substrate 10a into multiple active areas 10c in which transistors are formed. A target layer 10g of the base is located above the transistors, and the material of the target layer 10g may include a metal conductive material.

In practical operation, the first sidewall material layer 14 is formed on the second sacrificial patterns 13 and the second hard mask layer 104, and the first sidewall material layer 14 is etched with the first sidewall material layer 14 on the sidewalls of the second sacrificial patterns 13 being retained, which includes the following operations. First of all, the first sidewall material layer 14 mentioned in the above embodiment is formed by using a process including but not limited to a Chemical Vapor Deposition process, a Physical Vapor Deposition process or an atomic layer deposition process. Herein the material of the first sidewall material layer 14 may include at least one of silicon oxide, silicon nitride, silicon oxynitride, silicon carbide, silicon oxycarbide, silicon carbonitride, silicon oxycarbonitride or boron nitride. The first sidewall material layer 14 is etched by using an anisotropic etching process. The anisotropic etching process may include a plasma etching process, which has a high etch selectivity and anisotropy. The first sidewall material layer 14 on top of the second sacrificial patterns 13 and above the second hard mask layer 104 is removed by etching, and lateral etching is not performed on the first sidewall material layer 14 on the sidewalls of the second sacrificial patterns 13, so as to retain the first sidewall material layer 14 covering the sidewalls of the second sacrificial patterns 13.

In some embodiments, the self-aligned process is the self-aligned quadruple patterning process, and the method for manufacturing the semiconductor structure is used for manufacturing at least one of a node contact plug or a word line trench.

The following description is given by taking manufacturing the node contact plug and the word line trench through the self-aligned quadruple patterning process as an example.

When the self-aligned quadruple patterning process is used for manufacturing the node contact plug or the word line trench, as illustrated in FIG. 4A to 4D, the stack layer 11 further includes a third etching stop layer 107 located above the first sacrificial layer 103, a second sacrificial layer 108 located above the third etching stop layer 107 and a fourth etching stop layer 109 located above the second sacrificial layer 108. The second hard mask patterns 19 are formed on the first sacrificial layer 103 through the self-aligned process, which includes the following operations. A patterned photoresist layer 12 is formed on the fourth etching stop layer 109. The fourth etching stop layer 109 and the second sacrificial layer 108 are etched to transfer the patterned photoresist layer 12 to the second sacrificial layer 108, so as to form second sacrificial patterns 13. A first sidewall material layer 14 is formed on the second sacrificial patterns 13 and the third etching stop layer 107. The first sidewall material layer 14 is etched with the first sidewall material layer 14 on sidewalls of the second sacrificial patterns 13 being retained. The second sacrificial patterns 13 are removed, so as to expose the third etching stop layer 107 and form first sidewall patterns 15. In practical operation, the first sidewall material patterns 15 is formed by using a process including but not limited to a Chemical Vapor Deposition process, a Physical Vapor Deposition process or an atomic layer deposition process. Herein, the material of the first sidewall material layer 14 may include at least one of silicon oxide, silicon nitride, silicon oxynitride, silicon carbide, silicon oxycarbide, silicon carbonitride, silicon oxycarbonitride or boron nitride. The first sidewall material layer 14 is etched by using an anisotropic etching process. The anisotropic etching process may include a plasma etching process, which has a high etch selectivity and anisotropy. The first sidewall material layer 14 on top of the second sacrificial patterns 13 and above the third etching stop layer 107 is removed by etching, and lateral etching is not performed on the first sidewall material layer 14 on the sidewalls of the second sacrificial patterns 13, so as to retain the first sidewall material layer 14 covering the sidewalls of the second sacrificial patterns 13 and form the first sidewall patterns 15.

When the self-aligned quadruple patterning process is used for manufacturing the node contact plug, as illustrated in FIG. 4E to 4I, the stack layer 11 further includes a second hard mask layer 104 located above the first sacrificial layer 103 and below the third etching stop layer 107, a second etching stop layer 105 located above the second hard mask layer 104 and a third hard mask layer 106 located above the second etching stop layer 105. The second hard mask patterns 19 are formed on the first sacrificial layer 103 through the self-aligned process, which includes the following operations. After the first sidewall patterns 15 are formed, the third etching stop layer 107 and the third hard mask layer 106 are etched with the first sidewall patterns 15 as a mask to transfer the first sidewall patterns 15 to the third hard mask layer 106, so as to form third hard mask patterns 16. A second sidewall material layer 17 is formed on the third hard mask patterns 16 and the second etching stop layer 105. The second sidewall material layer 17 is etched with the second sidewall material layer 17 on sidewalls of the third hard mask patterns 16 being retained. The third hard mask patterns 16 are removed, so as to expose the second etching stop layer 105 and form second sidewall patterns 18. The second etching stop layer 105 and the second hard mask layer 104 are etched with the second sidewall patterns 18 as a mask to transfer the second sidewall patterns 18 to the second hard mask layer 104, so as to form the second hard mask patterns 19.

Figure 4A:
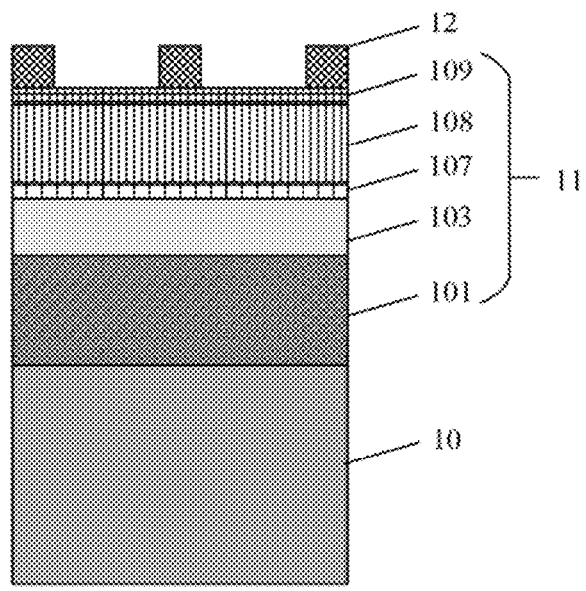
FIG. 4A to 4I are structural diagrams of the semiconductor structure in the manufacturing process according to the embodiments of the present disclosure.
Figure 4B:
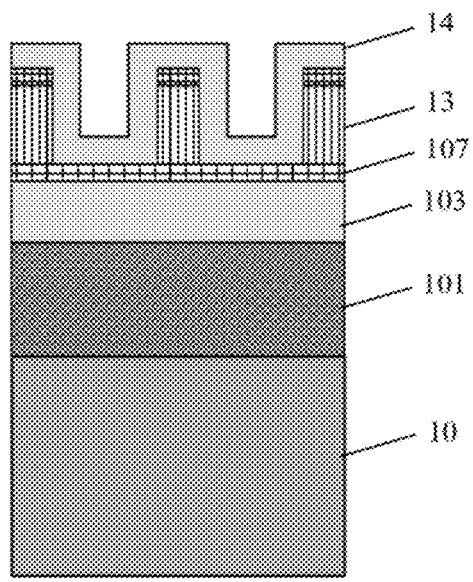
Figure 4C:
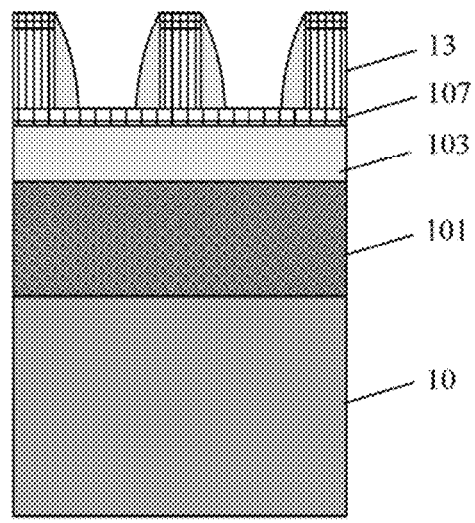
Figure 4D:
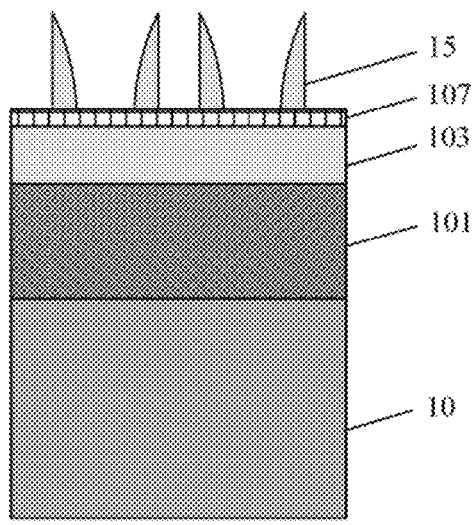
Figure 4E:
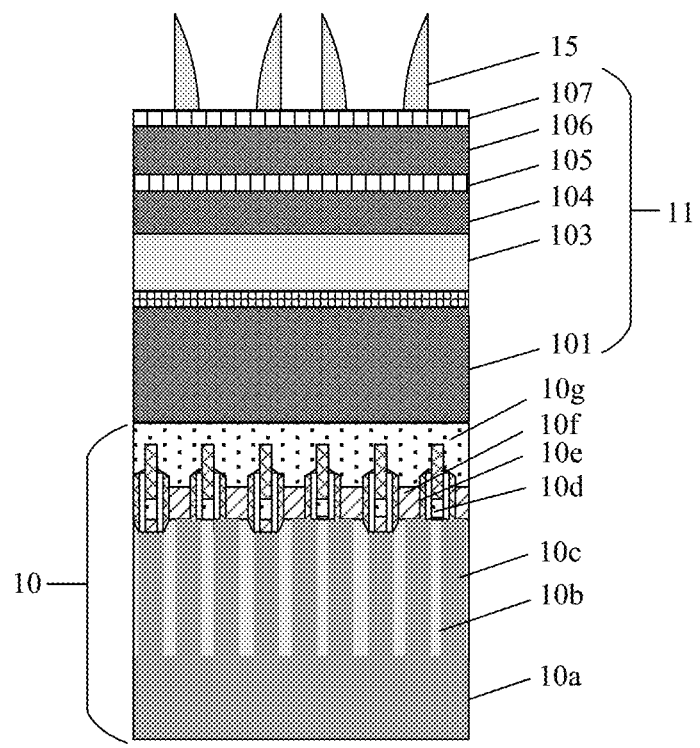
Figure 4F:
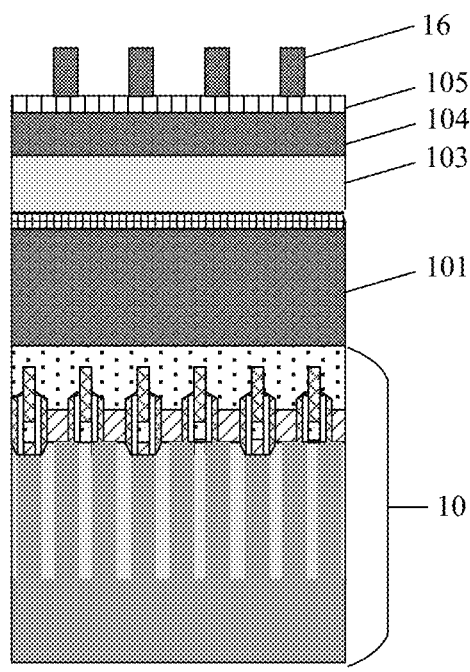
Figure 4G:
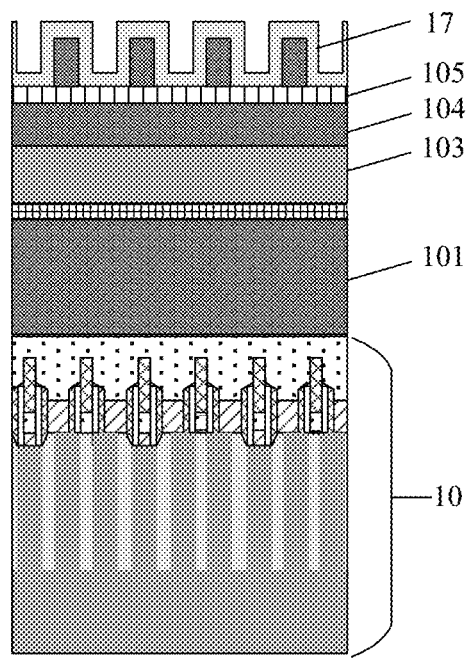
Figure 4H:
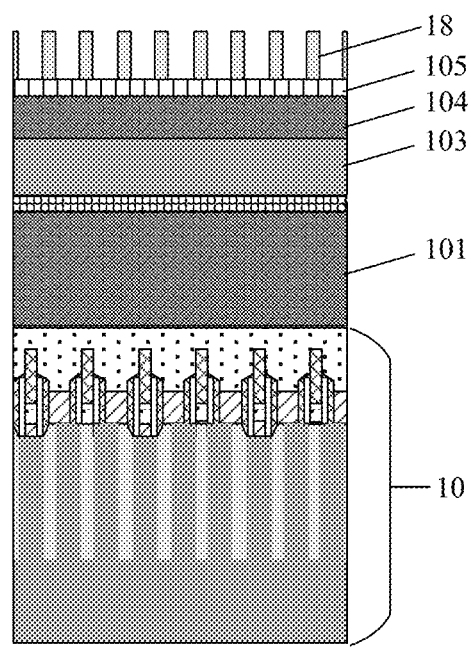
Figure 4I:
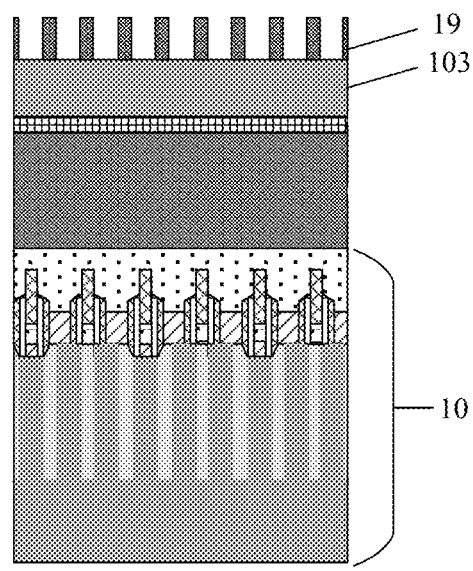

In the above-mentioned embodiments, when manufacturing the node contact plug in the semiconductor structure, as illustrated in FIG. 4E, the base 10 may include a substrate 10a, the substrate 10a may be, for example, a simple semiconductor material substrate (e.g. Si substrate, Ge substrate, etc.), a composite semiconductor material substrate (e.g. SiGe substrate, etc.), an SOI substrate, or a GeOI substrate, etc. An isolation structure 10b in the substrate 10a may include shallow trenches and an isolation material filled in the shallow trenches. The isolation structure 10b isolates the substrate 10a into multiple active areas 10c. Multiple parallel bit line structures 10d and multiple parallel isolation barriers (not shown) are formed above the substrate 10a. The multiple isolation barriers and the multiple bit line structures 10d intersect with each other to form multiple openings 10e. A dielectric layer 10f is filled in the lower part of the openings 10e. A node contact plug material layer, which is defined as a target layer 10g of the base, is formed above the dielectric layer 10f.

In practical operation, the second sidewall patterns 18 is formed by using a process including but not limited to a Chemical Vapor Deposition process, a Physical Vapor Deposition process or an atomic layer deposition process. Herein, the material of the second sidewall material layer 17 may include at least one of silicon oxide, silicon nitride, silicon oxynitride, silicon carbide, silicon oxycarbide, silicon carbonitride, silicon oxycarbonitride or boron nitride. The second sidewall material layer 17 is etched by using an anisotropic etching process. The anisotropic etching process may include a plasma etching process, which has a high etch selectivity ratio and anisotropy. The second sidewall material layer 17 on top of the third hard mask patterns 16 and above the second etching stop layer 105 is removed by etching, and lateral etching is not performed on the second sidewall material layer 17 on the sidewalls of the third hard mask patterns 16, so as to retain the second sidewall material layer 17 covering the sidewalls of the third hard mask patterns 16 and form the second sidewall patterns 18.

When the self-aligned quadruple patterning process is used for manufacturing the word line trench, as illustrated in FIG. 4A to 4D and FIG. 5A to 5D, the stack layer 11 further includes a third hard mask layer 106 located above the first sacrificial layer 103 and below the third etching stop layer 107. The second hard mask patterns 19 are formed on the first sacrificial layer 103 through the self-aligned process, which includes the following operations. After the first sidewall patterns are formed, the third etching stop layer 107 and the third hard mask layer 106 are etched to transfer the first sidewall patterns 15 to the third hard mask layer 106, so as to form third hard mask patterns 16. A second sidewall material layer 17 is formed on the third hard mask patterns 16 and the first sacrificial layer 103. The second sidewall material layer 17 is etched with the second sidewall material layer 17 on sidewalls of the third hard mask patterns 16 being retained. The third hard mask patterns 16 are removed, so as to expose the first sacrificial layer 103 and form the second hard mask patterns 19.

Figure 5A:
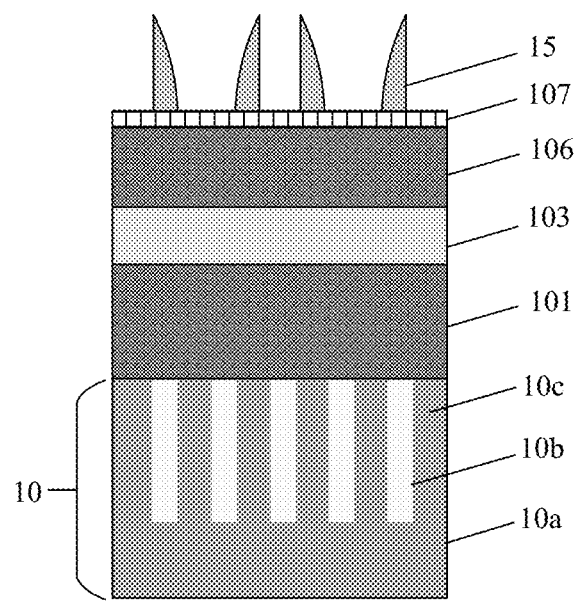
FIG. 5A to 5D are structural diagrams of the semiconductor structure in the manufacturing process according to the embodiments of the present disclosure.
Figure 5B:
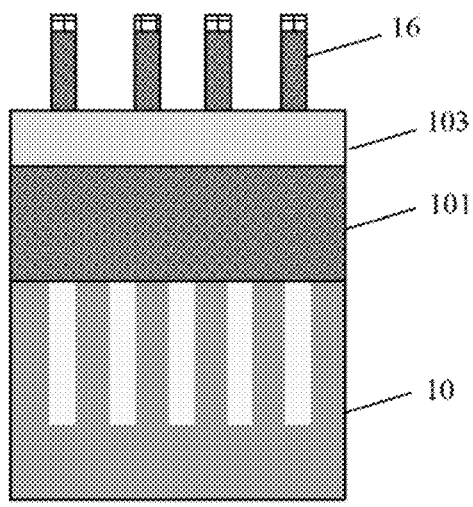
Figure 5C:
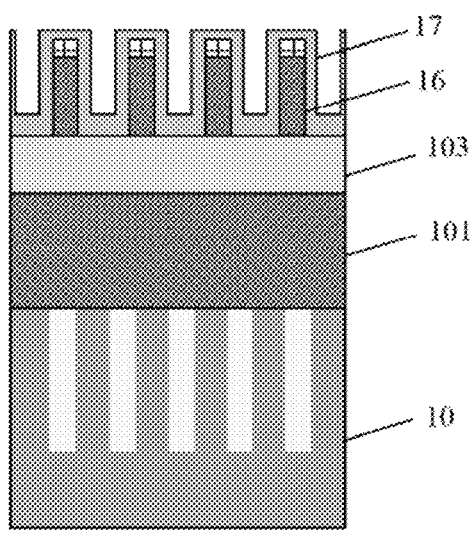
Figure 5D:
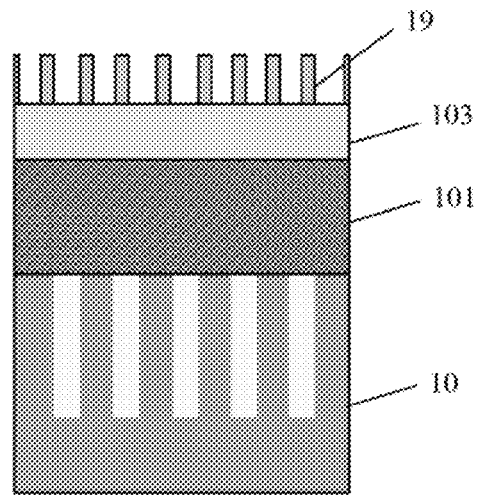

In the above-mentioned embodiments, when manufacturing the word line trench in the semiconductor structure, as illustrated in FIG. 5A, the base 10 may include a substrate 10a, the substrate 10a may be, for example, a simple semiconductor material substrate (e.g. Si substrate, Ge substrate, etc.), a composite semiconductor material substrate (e.g. SiGe substrate, etc.), an SOI substrate, or a GeOI substrate, etc. An isolation structure 10b in the substrate 10a may include shallow trenches and an isolation material filled in the shallow trenches. The isolation structure 10b isolates the substrate 10a into multiple active areas 10c. The substrate layer where the active areas 10c are located is a target layer 10g of the base.

In the above-mentioned embodiments, when manufacturing different semiconductor structure devices, the stack layer 11 may include different film layers. The film layers may be sequentially formed by using a deposition process, such as a Chemical Vapor Deposition (CVD) process, a Physical Vapor Deposition (PVD) process, or the like. Herein, the materials of the second hard mask layer 104 and the third hard mask layer 106 may include, but are not limited to, silicon oxynitride (SiON), polysilicon (Poly), Amorphous Carbon Layer (ACL), Oxide, or the like. The materials of the second etching stop layer 105, the third etching stop layer 107 and the fourth etching stop layer 109 may include, but are not limited to, silicon-containing compounds or metal oxides, such as titanium oxide, zirconia, tungsten oxide, or the like. The second sacrificial layer 108 can be formed by Spin on Hardmask (SOH). The SOH layer may be formed by a spin coating process. The SOH layer may be an insulating layer of a hydrocarbon (CxHy) system, which may include a silicon hard mask material, a carbon hard mask material, an organic hard mask material, or the like (e.g. silicon oxynitride layer).

Figure 6A:
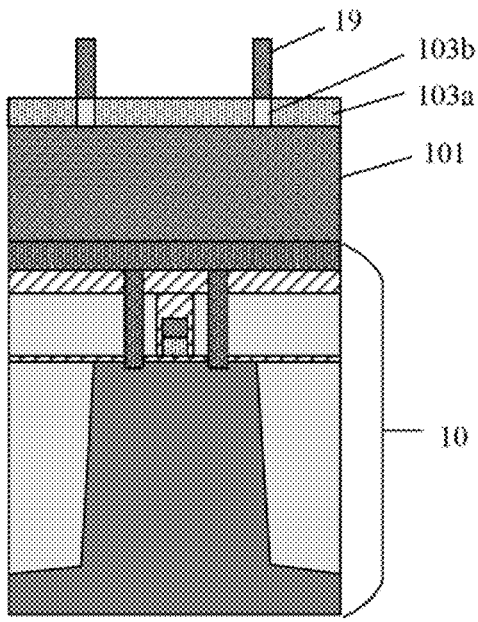
FIG. 6A to 6C are structural diagrams of the semiconductor structure in the manufacturing process according to the embodiments of the present disclosure.
Figure 6B:
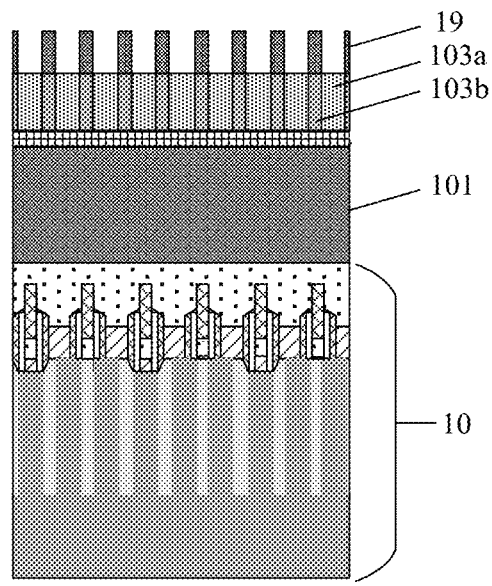
Figure 6C:
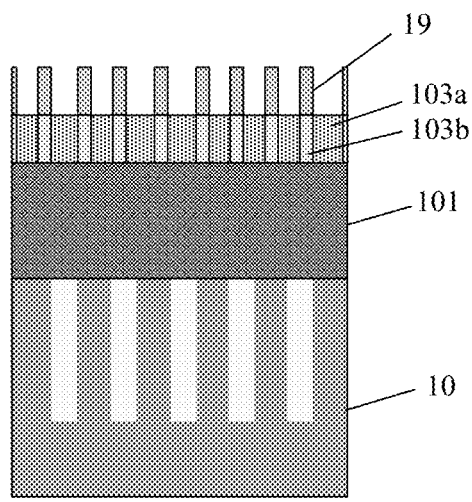
Figure 7A:
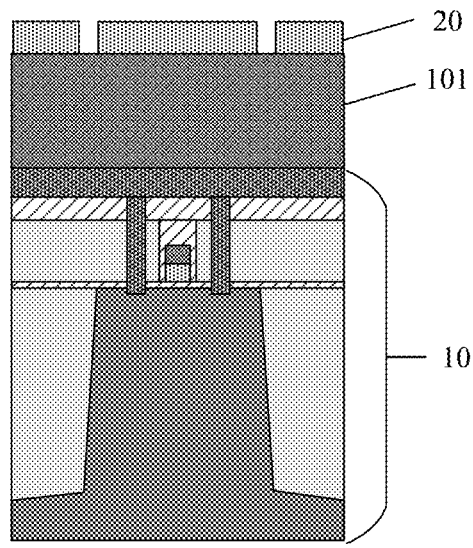
FIG. 7A to 7C are structural diagrams of the semiconductor structure in the manufacturing process according to the embodiments of the present disclosure.
Figure 7B:
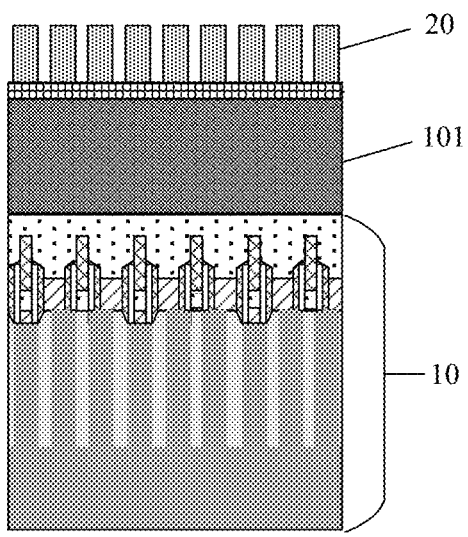
Figure 7C:
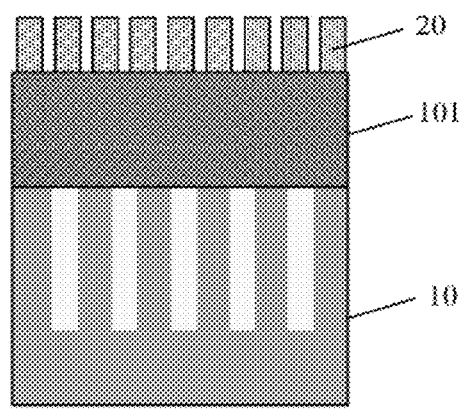

At block S103, as illustrated in FIG. 6A to 6C, a doping process is performed, to dope the region of the first sacrificial layer 103 exposed from gaps between the second hard mask patterns 19.

The first sacrificial layer 103 is doped to change the etching rate of the doped region 103a of the first sacrificial layer, thereby changing the etch selectivity ratio between an undoped region 103b of the first sacrificial layer and the doped region 103a of the first sacrificial layer, so that the selective etching can be performed to remove the undoped region 103b of the first sacrificial layer and retain the doped region 103a of the first sacrificial layer, so as to form mask patterns with stable morphology and standard spacing.

In some embodiments, as illustrated in FIG. 6A to 6C, the region of the first sacrificial layer 103 exposed from the gaps between the second hard mask patterns 19 is doped, which includes the following operation. A first doping process is performed, in which an entirety of the exposed region of the first sacrificial layer 103 is doped with a first type of doping element.

The exposed region of the first sacrificial layer 103 is doped with the first type of doping element, which is mainly used to change the etching rate of the doped region of the first sacrificial layer 103, so as to remove the undoped region 103b of the first sacrificial layer through wet etching, without affecting the doped region 103a of the first sacrificial layer.

In practical operation, the first type of doping element is selected from one or more of boron, phosphorus and nitrogen.

In some embodiments, the etch selectivity ratio between the undoped region 103b of the first sacrificial layer and the doped region 103a of the first sacrificial layer is greater than 10, for example, 11, 15, or 20 etc.

By doping the exposed region of the first sacrificial layer 103 with the first type of doping element, the etch selectivity ratio can be controlled, and a suitable etch selectivity ratio enables better controllability and stability when the undoped region 103b of the first sacrificial layer is subsequently removed through the wet etching.

In some specific embodiments, as illustrated in FIG. 6A to 6C, the exposed region of the first sacrificial layer 103 includes a first sub-part (not shown) and a second sub-part (not shown) located below the first sub-part. The region of the first sacrificial layer 103 exposed from the gaps between the second hard mask patterns 19 is doped, which further includes the following operation. A second doping process is performed, in which the second sub-part is doped with a second type of doping element. Herein, the second type of doping element is the same as the first type of doping element. The doping elements of the first doping and the second doping are the same, so that the bottom morphology of the doped region 103a of the first sacrificial layer can be controlled, and the influence on the first doping process can be avoided.

The second sub-part of the exposed region of the first sacrificial layer 103 is doped with the second type of doping element, and the second type of doping element is the same as the first type of doping element, so that concentration of the first type of doping element contained in lower part of the doped region 103a of the first sacrificial layer is higher than concentration of the first type of doping element contained in upper part of the doped region 103a of the first sacrificial layer, thereby ensuring the controllability of the bottom morphology of the doped region 103a of the first sacrificial layer in the subsequent wet etching.

In some specific embodiments, as illustrated in FIG. 6A to 6C, the region of the first sacrificial layer 103 exposed from the gaps between the second hard mask patterns 19 is doped, which further includes the following operation. A third doping process is performed, in which the entirety of the exposed region of the first sacrificial layer 103 is doped with a third type of doping element. Herein, the third type of doping element is selected from one or more of carbon and germanium.

After being doped with the first type of doping element, the exposed region of the first sacrificial layer 103 is doped with the third type of doping element to change the mobility of the first type of doping element, so that the first type of doping element in the doped region 103a of the first sacrificial layer are more stably distributed in the doped region 103a of the first sacrificial layer. Therefore, the doped region 103a of the first sacrificial layer can be more stable in the wet etching, thereby improving controllability and stability of the process of forming the mask patterns.

In practical operation, the exposed region of the first sacrificial layer 103 is doped with elements by an ion implantation process. During the first doping process, the first type of doping element is injected into the entirety of the exposed region of the first sacrificial layer 103. During the second doping process, the second type of doping element, which is the same as the first type of doping element, is injected into the second sub-part of the exposed region of the first sacrificial layer 103. The ion implantation dose for the second doping process is high and the implantation position is deep enough. During the third doping process, the third type of doping element is injected into the entirety of the exposed region of the first sacrificial layer 103.

At block S104, as illustrated in FIG. 6A to 6C and FIG. 7A to 7C, the second hard mask patterns 19 are removed. The undoped region of the first sacrificial layer is removed through the selective etching process, so as to form the first sacrificial patterns 20.

In some embodiments, as illustrated in FIG. 7A to 7C and FIG. 8A to 8C, the stack layer 11 further includes a first hard mask layer 101 located below the first sacrificial layer 103. After the first sacrificial patterns 20 are formed, the method further includes the following operations. The first hard mask layer 101 is etched to transfer the first sacrificial patterns 20 to the first hard mask layer 101, so as to form the first hard mask patterns (not shown). The target layer of the base is patterned with the first hard mask patterns as a mask, so as to form target patterns 22 in the target layer.

As disclosed in the above mentioned embodiments, embodiments of the present disclosure can manufacture multiple types of target patterns 22 by controlling the structure of the base and the type of self-aligned process, such as one or more of a peripheral conductive structure, a bit line contact, a node contact plug, a word line trench, and the like.

It should be understood that by replacing different bases and self-aligned processes, the method for manufacturing the semiconductor structure provided in the embodiments of the present disclosure can be used in any process flow requiring stable and fine patterning.

Figure 8A:
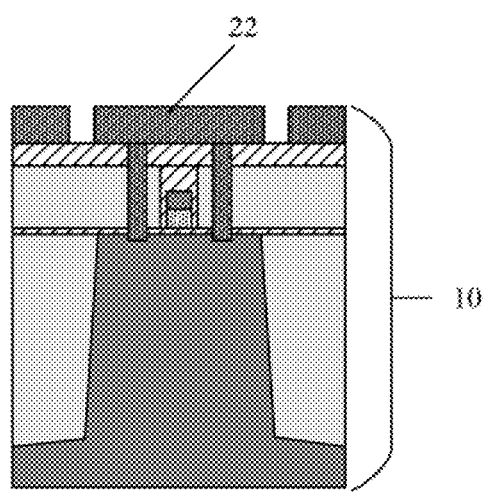
FIG. 8A to 8C are structural diagrams of the semiconductor structure in the manufacturing process according to the embodiments of the present disclosure.
Figure 8B:
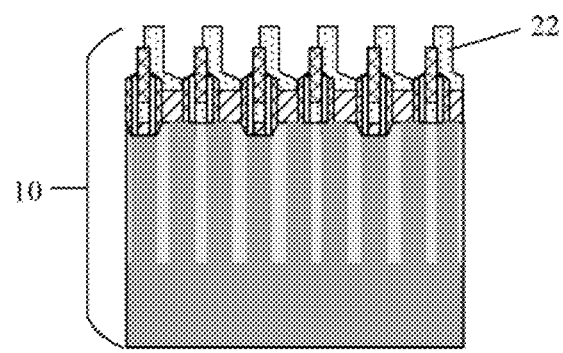
Figure 8C:
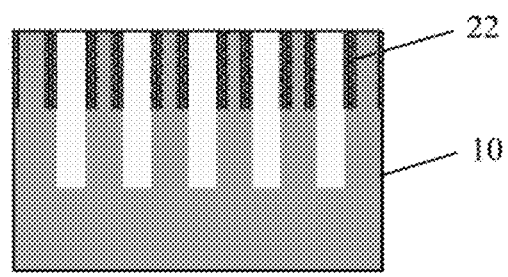

The target patterns with a standard spacing are formed on the target layer of the base by transferring the first sacrificial patterns with stable morphology and accurate size onto the base. The target patterns manufactured by using the method for manufacturing the semiconductor structure of the above embodiments can be used to manufacture different semiconductor devices, such as peripheral conductive contact patterns on the base (as illustrated in FIG. 8A), node contact plugs on the base (as illustrated in FIG. 8B) and the word line trenches on the base (as illustrated in FIG. 8C). The manufacturing method of the above mentioned embodiments has the good controllability and stability, which can mitigate the problems such as falling off and missing of the node contact plug, poor peripheral conductive contact, poor word line contact, or the like.

In practical operation, the material of the first hard mask layer 101 may include, but is not limited to, SiON, Poly, ACL, Oxide, or the like. The first sacrificial patterns 20 can be transferred to the target layer of the base via the first hard mask layer 101 by using an anisotropic etching process, such as a plasma etching process.

Figure 9:
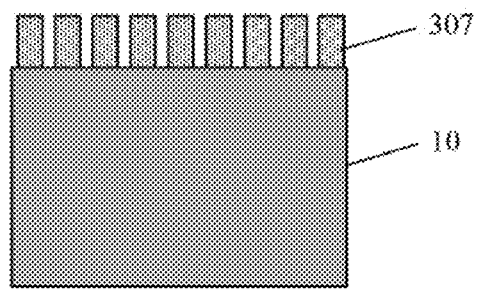
FIG. 9 is a cross-sectional diagram of a semiconductor structure according to an embodiment of the present disclosure.

Embodiments of the present disclosure further provide a semiconductor structure. As illustrated in FIG. 9, the semiconductor structure includes a mask 307.

A material of the mask 307 includes an amorphous elemental semiconductor material. The amorphous elemental semiconductor material includes a first type of doping element and a second type of doping element. Herein the second type of doping element includes one or more of carbon and germanium.

In practical operation, as illustrated in FIG. 9, the mask 307 may be formed above a base 10. The base 10 may be, for example, a simple semiconductor material substrate (e.g. silicon (Si) substrate, germanium (Ge) substrate, etc.), a composite semiconductor material substrate (e.g. silicon germanium (SiGe) substrate, etc.), a silicon on insulator (SOI) substrate, a germanium on insulator (GeOI) substrate, or the like. The amorphous elemental semiconductor material included in the mask 307 may include amorphous silicon (Si), amorphous germanium (Ge), amorphous tin (Sn), or the like. The above-mentioned first type of doping element may include one or more of boron, phosphorus and nitrogen.

In some embodiments, the mask 307 includes a third sub-part (not shown) and a fourth sub-part (not shown) located below the third sub-part. A concentration of the first type of doping element contained in the fourth sub-part is higher than a concentration of the first type of doping element contained in the third sub-part.

As described above, according to the present disclosure, second hard mask patterns are formed on a first sacrificial layer of a base. A region of the first sacrificial layer exposed from gaps between the second hard mask patterns is doped with element, so as to change an etching rate of the doped region of the first sacrificial layer. Then, an undoped region of the first sacrificial layer is removed through a selective etching method, so as to form first sacrificial patterns. The method for manufacturing the semiconductor structure in the embodiments of the present disclosure uses the selective etching method to reversely remove the undoped region of the first sacrificial layer, so as to form a standard spacing, which can avoid the load effect caused by backfilling the hard mask material layer for etching in the commonly used self-aligned patterning process. Therefore, the process can accurately control the critical sizes and the etching depth, and have good controllability and stability.

It should be noted that the method for manufacturing the semiconductor structure and the semiconductor structure provided by the embodiments of the present disclosure can be applied to any integrated circuit including the semiconductor structure. The technical features in the technical schemes of the embodiments can be combined arbitrarily combined without conflict.

The above are only preferred embodiments of the disclosure, and are not intended to limit the scope of protection of the present disclosure. Any modification, equivalent replacement and improvement made within the spirit and principles of the present disclosure should be included in the scope of protection of the present disclosure.

What is claimed is:

1. A method for manufacturing a semiconductor structure, comprising:
providing a base and forming a stack layer on the base, wherein the stack layer comprises at least a first sacrificial layer, and a material of the first sacrificial layer comprises an amorphous elemental semiconductor material;
forming second hard mask patterns on the first sacrificial layer through a self-aligned process;
performing a doping process, comprising: doping a region of the first sacrificial layer exposed from gaps between the second hard mask patterns;
removing the second hard mask patterns; and
removing an undoped region of the first sacrificial layer through a selective etching process, so as to form first sacrificial patterns.

2. The method for manufacturing the semiconductor structure of claim 1, wherein doping the region of the first sacrificial layer exposed from the gaps between the second hard mask patterns comprises:
performing a first doping process, comprising: doping an entirety of the exposed region of the first sacrificial layer with a first type of doping element.

3. The method for manufacturing the semiconductor structure of claim 2, wherein the exposed region of the first sacrificial layer comprises a first sub-part and a second sub-part located below the first sub-part,
wherein doping the region of the first sacrificial layer exposed from the gaps between the second hard mask patterns further comprises:
performing a second doping process, comprising: doping the second sub-part with a second type of doping element, the second type of doping element being the same as the first type of doping element.

4. The method for manufacturing the semiconductor structure of claim 2, wherein doping the region of the first sacrificial layer exposed from the gaps between the second hard mask patterns further comprises:
performing a third doping process, comprising: doping the entirety of the exposed region of the first sacrificial layer with a third type of doping element, wherein the third type of doping element is selected from one or more of carbon and germanium.

5. The method for manufacturing the semiconductor structure of claim 1, wherein an etch selectivity between the undoped region of the first sacrificial layer and the doped region of the first sacrificial layer is greater than 10.

6. The method for manufacturing the semiconductor structure of claim 1, wherein the stack layer further comprises a first hard mask layer located below the first sacrificial layer, and after forming the first sacrificial patterns, the method further comprises:
etching the first hard mask layer to transfer the first sacrificial patterns to the first hard mask layer, so as to form the first hard mask patterns; and
patterning a target layer of the base with the first hard mask patterns as a mask, so as to form target patterns in the target layer.

7. The method for manufacturing the semiconductor structure of claim 1, wherein the self-aligned process comprises one or more of a self-aligned double patterning process, a self-aligned quadruple patterning process and a self-aligned reverse patterning process.

8. The method for manufacturing the semiconductor structure of claim 7, wherein the self-aligned process is the self-aligned double patterning process, and the method for manufacturing the semiconductor structure is used for manufacturing at least one of a peripheral conductive structure or a bit line contact.

9. The method for manufacturing the semiconductor structure of claim 8, wherein the stack layer further comprises a second hard mask layer located above the first sacrificial layer, a second sacrificial layer located above the second hard mask layer and a fourth etching stop layer located above the second sacrificial layer,
wherein forming the second hard mask patterns on the first sacrificial layer through the self-aligned process comprises:
forming a patterned photoresist layer on the fourth etching stop layer, etching the fourth etching stop layer and the second sacrificial layer to transfer the patterned photoresist layer to the second sacrificial layer, so as to form second sacrificial patterns;
forming a first sidewall material layer on the second sacrificial patterns and the second hard mask layer;
etching the first sidewall material layer with the first sidewall material layer on sidewalls of the second sacrificial patterns being retained; and
removing the second sacrificial patterns to expose the second hard mask layer, and etching the second hard mask layer with the retained first sidewall material layer as a mask, so as to form the second hard mask patterns.

10. The method for manufacturing the semiconductor structure of claim 7, wherein the self-aligned process is the self-aligned quadruple patterning process, and the method for manufacturing the semiconductor structure is used for manufacturing at least one of a node contact plug or a word line trench.

11. The method for manufacturing the semiconductor structure of claim 10, wherein the stack layer further comprises a third etching stop layer located above the first sacrificial layer, a second sacrificial layer located above the third etching stop layer and a fourth etching stop layer located above the second sacrificial layer,
wherein forming the second hard mask patterns on the first sacrificial layer through the self-aligned process comprises:
forming a patterned photoresist layer on the fourth etching stop layer, and etching the fourth etching stop layer and the second sacrificial layer to transfer the patterned photoresist layer to the second sacrificial layer, so as to form second sacrificial patterns;
forming a first sidewall material layer on the second sacrificial patterns and the third etching stop layer;
etching the first sidewall material layer with the first sidewall material layer on sidewalls of the second sacrificial patterns being retained; and
removing the second sacrificial patterns, so as to expose the third etching stop layer and form first sidewall patterns.

12. The method for manufacturing the semiconductor structure of claim 11, wherein the stack layer further comprises a second hard mask layer located above the first sacrificial layer and below the third etching stop layer, a second etching stop layer located above the second hard mask layer and a third hard mask layer located above the second etching stop layer,
wherein forming the second hard mask patterns on the first sacrificial layer through the self-aligned process comprises:
after forming the first sidewall patterns, etching the third etching stop layer and the third hard mask layer with the first sidewall patterns as a mask to transfer the first sidewall patterns to the third hard mask layer, so as to form third hard mask patterns;
forming a second sidewall material layer on the third hard mask patterns and the second etching stop layer;

etching the second sidewall material layer with the second sidewall material layer on sidewalls of the third hard mask patterns being retained;

removing the third hard mask patterns, so as to expose the second etching stop layer and form second sidewall patterns;

etching, with the second sidewall patterns as a mask, the second etching stop layer and the second hard mask layer to transfer the second sidewall patterns to the second hard mask layer, so as to form the second hard mask patterns.

13. The method for manufacturing the semiconductor structure of claim 11, wherein the stack layer further comprises a third hard mask layer located above the first sacrificial layer and below the third etching stop layer, wherein forming the second hard mask patterns on the first sacrificial layer through the self-aligned process comprises:

after forming the first sidewall patterns, etching the third etching stop layer and the third hard mask layer to transfer the first sidewall patterns to the third hard mask layer, so as to form third hard mask patterns;

forming a second sidewall material layer on the third hard mask patterns and the first sacrificial layer;

etching the second sidewall material layer with the second sidewall material layer on sidewalls of the third hard mask patterns being retained;

removing the third hard mask patterns, so as to expose the first sacrificial layer and form the second hard mask patterns.

* * * * *